United States Patent [19]

Metz

[11] 3,998,377

[45] Dec. 21, 1976

[54] METHOD OF AND APPARATUS FOR BONDING WORKPIECES

[75] Inventor: Jack L. Metz, Des Plaines, Ill.

[73] Assignee: Teletype Corporation, Skokie, Ill.

[22] Filed: Mar. 29, 1976

[21] Appl. No.: 671,198

Related U.S. Application Data

[63] Continuation of Ser. No. 530,642, Dec. 9, 1974, abandoned.

[52] U.S. Cl. .......................... 228/180 A; 228/106; 228/212; 228/44.1 A
[51] Int. Cl.² ...................................... H01L 21/603
[58] Field of Search ............. 29/626; 228/6 A, 5.5, 228/44.1 A, 106, 180 A, 212, 213

[56] References Cited

UNITED STATES PATENTS

| | | | |
|---|---|---|---|
| 3,501,832 | 3/1970 | Saburo Iwata et al. | 29/626 |
| 3,520,055 | 7/1970 | Jannett | 228/44.1 A X |
| 3,541,673 | 11/1970 | Cushman | 228/106 X |
| 3,655,177 | 4/1972 | Coucoulas | 228/5.5 X |
| 3,670,396 | 6/1972 | Lindberg | 228/106 |
| 3,713,575 | 1/1973 | Cushman | 228/6 A |
| 3,724,068 | 4/1973 | Galli | 29/626 |

Primary Examiner—Al Lawrence Smith
Assistant Examiner—K. J. Ramsey
Attorney, Agent, or Firm—M. Pfeffer

[57] ABSTRACT

A method of and apparatus for bonding together a first and a second workpiece, which are bondable by applying energy thereto while they are urged together at a bonding site. First, the workpieces are urged together by moving into engagement with the first workpiece, and then slightly deforming, a rigid, self-supporting, deformable planar member. The deformation is not only effective to urge the workpieces together, but also forms a capillary space between the member and the first workpiece. Then, the energy is passed to the bonding site. If the energy should produce, molten components at the site, they are attracted into the capillary space to prevent them from creeping up the workpieces and from undesirably building up at the bond site. Multiple pairs of workpieces may be simultaneously bonded by overlying all of the bonding sites with the member and by deforming it by the application of a force at a point generally central to all of the bonding sites.

The planar member may be a piece of glass through which alignment of the workpieces and and the formation of the bond may both be observed.

28 Claims, 2 Drawing Figures

METHOD OF AND APPARATUS FOR BONDING WORKPIECES

This is a continuation of application Ser. No. 530,642 filed Dec. 9, 1974 now abandoned.

This invention relates to a method of and apparatus for bonding together workpieces, and, more specifically, to a method of and an apparatus for bonding leads to corresponding contacts on electrical circuitry such as integrated circuit packages.

In many manufacturing fields it is desirable to bond together or to interconnect two workpieces. One field in which workpiece bonding assumes great importance is the semiconductor and transistor industry. In that industry it is usually necessary to interconnect or to bond together electrical leads and contacts of varying kinds. Included within this general category is the bonding of circuits such as integrated circuits (I.C.'s) to leads on substrates. The circuits are ultimately connected via the leads to external circuitry.

There are three primary problem areas in lead bonding. These problems exist whether the bonding being effected is solder bonding, or other types of intermetallic bonding such as eutectic bonding. In either case molten components, usually metallic, are generated during the bonding process.

The first major problem experienced in the industry is one of alignment. Specifically, it is often difficult to align at a bonding site an electrical contact and a lead to which the contact is to be bonded, especially when both are quite small. In some arrangements alignment is effected with a bonding facility, such as a bonding tool or bonding tip, moved away from the vicinity of the bonding site. After precise alignment has been effected the bonding tip is made to coincide with the axis of alignment, both steps often being performed with precision optical equipment. This type of alignment is complicated, requires costly equipment, and is, of course, time-consuming.

Another problem in the industry is the observation at the site of a bond during its formation. Because most bonds are effected by bonding tips or bonding tools which are non-transparent, often large, members, it is often quite difficult to observe the bond as it is being formed. The quality of many of these bonds, whether of the solder type or the eutectic type, are not capable, in any event, of being evaluated "objectively" by optical sensors. Rather, the best way of observing and evaluating such bonds is often visual and depends on the skill and visual acuity of a human operator.

A third general problem in the industry involves molten components usually generated during bonding. Specifically, molten components formed during the application of bonding energy to the bonding site to effect soldering or eutectic bonding often "creep" up the lead or contact or both. Such creep may undesirably stiffen the lead or contact remote from the area of the bonding site. This stiffening often results in the breaking of the lead or contact in subsequent manufacturing operations due to increased rigidity. Moreover, it has been observed that instead of flexing, leads which are too stiff and rigid often are undesirably removed from the surfce on which they reside due to such stiffening.

Another facet of the problem involving the molten components at the bonding site is related to a build-up thereat of the molten components. This build-up often results in the undesirable grounding or shorting at the bonding site because the bonding site has been enlarged by the build-up.

All of the problems described above are further magnified when multiple, subminiature leads are being bonded to corresponding multiple contacts. Especially amplified is the alignment problem. In order to save time and to make manufacturing operations more efficient, many schemes have been devised for simultaneously bonding the multiple leads of a substrate or the like to the multiple contacts of an electrical circuit. Usually problems involving molten components are exacerbated when multiple leads are bonded because the usual means of effecting such multiple bonds is a bonding tool or tip which simultaneously contacts all bonding sites. Inherent in such tips is an overhang over the bonding sites, the overhang leading to even greater solder creep than may be experienced when single bonds are effected.

A new problem injected into the area by the bonding of multiple leads involves the fact that the bonding sites may reside at somewhat varying heights with respect with the bonding tool or tip. Various means have been devised in the prior art for effecting multiple bonds when the bonding sites occupy differing heights. Generally these solutions involve conformal or compliant bonding. See, for example, U.S. Pat. Nos. 3,699,640 and 3,608,809 assigned to the Western Electric Company, Inc.

While conformal or compliant bonding methods and apparatus have solved some of the problems of the prior art concerning bonding sites of varying heights, the apparatus may be somewhat complicated and difficult to set up and moveover the alignment and observation problems noted above are not inherently solved because the bonding tips and other bonding apparatus are not transparent.

It should be noted that the invention and the prior art relates to three different types of bonds. The first type of bond is a more or less conventional bond in which one workpiece is bonded to another. The workpieces may both be leads or one workpiece may be a lead and the second workpiece may be an electrical contact on an electrical component.

The second type of bond involved herein relates to a so-called beam lead. A general picture of a beam lead is shown in the aforementioned U.S. Pat. No. 3,699,640. A beam leaded semiconductor device is generally designated by the numeral 30 in FIGS. 4 and 5 of that patent. In a beam leaded device a number of circuits are formed on a silicon wafer or the like and leads or beams are cantilevered from the silicon wafer (44 in FIG. 5 of the U.S. Pat. No. 3,699,640) to produce a completed device. It is these beam leads 44 which are bonded to external circuitry, such as conductive paths on the substrate 28 in the U.S. Pat. No. 3,699,640.

A third type of lead is a so-called reversed beam lead which is formed somewhat differently from the usual beam lead. Specifically, the reversed beam lead structure involves the formation of electrical circuits usually on silicon wafers, the last step of the manufacturing process being the formation of contact pads or bumps on the circuit. Conductors are formed on a substrate, often a flexible plastic. A window is formed through the substrate in such a manner that end or lead portions thereof "run out" over the window, that is, they are cantilevered over the window from the substrate. Ultimately the pads or bumps are bonded to the cantilevered leads in alignment with the window, often by a eutectic bonding technique.

All of the known prior art methods and apparatus for bonding leads have proved unsatisfactory from a wide variety of standpoints with respect to the formation of bonds of all three types but most especially with respect to the so-called reverse beam leads.

SUMMARY OF THE INVENTION

It is therefore an object of this invention to provide a method of and apparatus for bonding together workpieces. Another object of the present invention is the provision of a method of and apparatus for bonding together leads to corresponding contacts on electrical circuitry.

Yet another object of the present invention is a method of and apparatus for attaching by bonding an electrically conductive lead to a contact pad carried on the exterior of a packaged electrical circuit.

Further, an object of the present invention is the provision of a method of and apparatus for simultaneously bonding together the multiple leads on a substrate with corresponding multiple contact pads on a packaged I.C.

These and other objects are achieved by providing a method of and apparatus for bonding together a first and a second workpiece, the pieces being bondable by applying energy to a bonding site while they are urged together thereat. First, the workpieces are urged together by moving into engagement with the first workpiece, and then slightly deforming, a rigid, self-supporting, deformable planar member. The deformation, which renders the member slightly dish-shaped, is not only effective to urge the workpieces together, but also forms a capillary space between the member and the first workpiece. Lastly, energy is passed to the bonding site. Molten components generated due to the energy are attracted into the capillary space to prevent those components from creeping up either workpiece and from building up the bond site in an undesirable manner.

The apparatus of this invention includes appropriate facilities and instrumentalities for effecting the above method. In a preferred embodiment, the planar member is a piece of glass through which alignment of the workpieces and the formation of the bond may both be observed. In both the method and apparatus, multiple pairs of workpieces may be simultaneously bonded by overlying all of the bonding sites with the glass or other planer member and by deforming the glass via the application of a force to a point thereof generally central to all of the bonding sites.

BRIEF DESCRIPTION OF THE DRAWINGS

Other objects and features of the present invention will be more readily understood from the following detailed description of specific embodiments thereof when read in conjunction with the appended drawings in which.

DETAILED DESCRIPTION

Illustratively, the method of and apparatus of the present invention are both described in connection with the bonding of reverse beam lead semiconductor devices or I.C.'s. It is to be understood, however, that the present invention is more broadly applicable to the bonding art wherein a first workpiece is bonded to a second workpiece. This is especially true where the prior art problems of alignment, observation of bond formation, and creep and build-up of molten components at the bonding site are desired to be obviated.

First there will be described the method of bonding together a pair of workpieces according to the present invention.

Figure 1:
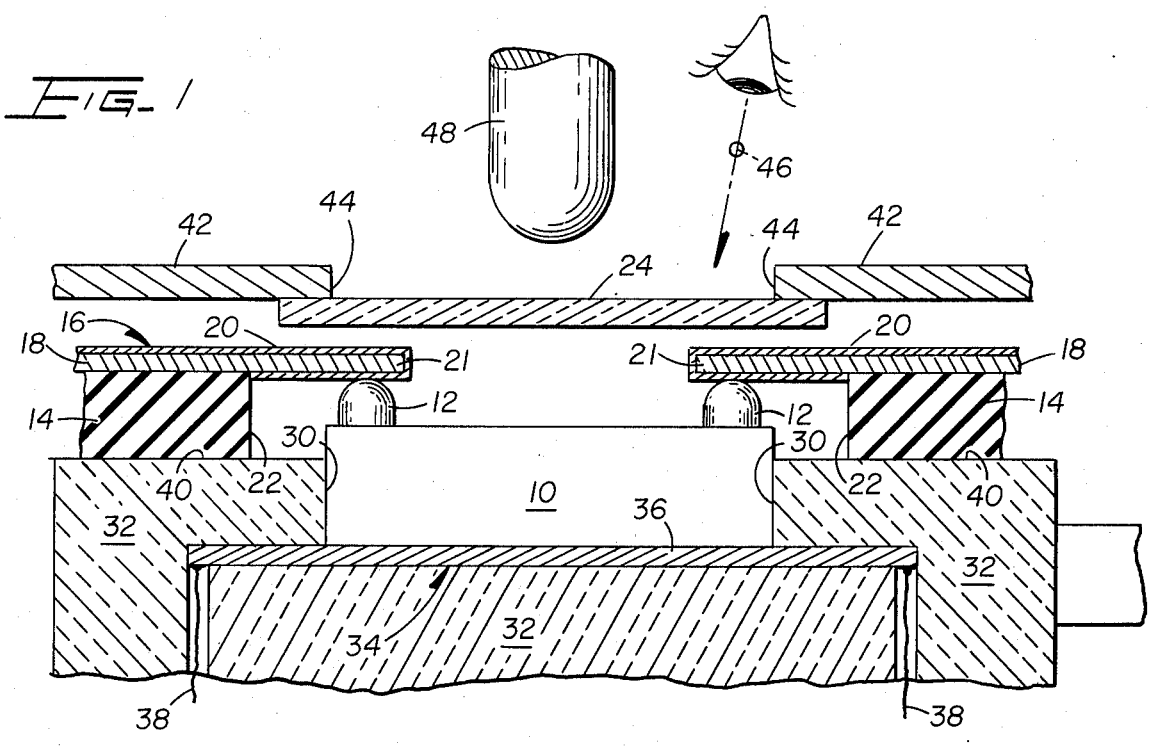
FIG. 1 is a partial elevational, sectional view of novel bonding apparatus useful for carrying out the bonding method of the present invention shown at a time just prior to the formation of a bond.

Referring to FIG. 1, there is shown an electrical circuit package 10 having thereon a plurality of pads or contacts 12, only two of which are shown because of the sectional nature of the FIG. The package 10 and the pads 12 together constitute a workpiece, although it should be apparent that other workpieces may be used in the place thereof.

Inside the package 10 there may be contained any of a wide variety of electrical components. For example, within the package 10 may be a plurality of I.C.'s formed by well-known techniques on one or more silicon chips. The pads 12 are intended to permit the electrical connection of the internal circuitry within the package 10 to external circuitry.

An example of one type of contact pads 12 are gold-plated contact pads intended to ultimately permit the formation of the eutectic bond with leads connected to external circuitry. The pads may be rounded as shown, or may have any other shape.

In the present example, the connection of the circuits within the package 10 to the external circuitry (not shown) is effected through the medium of a substrate 14 carrying thereon a number of printed circuit conductors 16. The conductors 16 are, as an example, copper foil 18 which has been plated with a thin plating of tin 20 at lead ends 21 thereof which may be flexible. The substrate 14 may be a rigid material such as ceramic or a flexible material such as a plastic including Kapton or Mylar plastic films or the like. Each lead 21 constitutes a first workpiece which is to be bonded to a second workpiece, here the pads 12.

Formed through the substrate 14 in the vicinity of the area where it is desired to bond the pads 12 to leads 21 a window 22 is formed through the substrate 14. The leads 21 extend into and over the window 22 as shown and positionally correspond to the positions of the pads 12 carried on the circuit package 10. As noted earlier, once the conductors 16 have been bonded to the pads 12 a reverse beam lead configuration is effected. It should be again noted that other configurations of leads and pads may be used, and, in fact, the articles it is desired to bond together need not even be electrical conductors.

Next, the leads 21 are positioned adjacent their corresponding pads 12 by any convenient facility and in any well-known manner.

Figure 2:
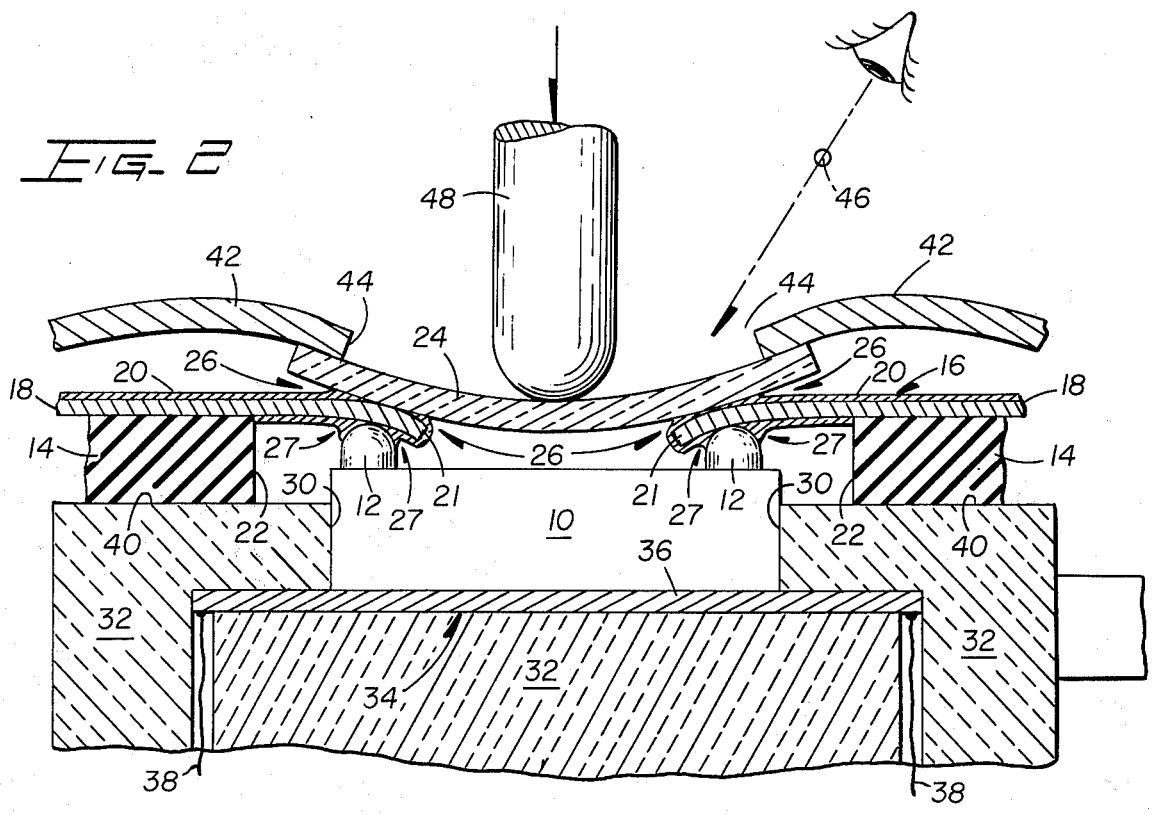
FIG. 2 is a partial, elevational, sectional view of the same bonding apparatus shown in FIG. 1 at a time during and just after the formation of a bond.

Now, a rigid, self-supporting, deformable, planar member 24 is positioned over the workpieces, namely the correspondingly adjacent leads 21 and pads 12, each pair of which constitutes a bonding site. The planar member is moved downwardly against the leads 21 by a force applied to a side thereof opposite the side adjacent the leads 21. Such force application urges the leads 21 and the pads 12 together. The planar member 24 should have sufficient flexibility to ultimately permit urging together of all of the lead/pad pairs 21/12 regardless of their height with respect to the member 24. One example of the type of flexible member useful in the present invention is microscope slide cover glass having a thickness within the range of 0.003 to 0.006 inches. Such glass permits observation therethrough of lead/contact alignment and subsequent bond formation, while having both sufficient flexibility to permit contact of all bonding sites regardless of their relative heights and sufficient rigidity to effect the necessary urging together of the workpieces. Other materials, such as the following, have been used successfully:

A. Transparent Materials
1. Kapton — 0.05 inch thick
2. Quartz — 0.003 to 0.006 inch thick B. Non-transparent Materials
1. Silicone Rubber — 0.060 inch thick
2. Mica — 0.006 to 0.010 inch thick Next as shown in FIG. 2 the urging of the member 24 is continued until that member slightly deforms, as shown, to create between its under surface and the leads 21, as well as portions of the conductors 16 adjacent the leads 21, capillary spaces 26. Upon deformation, the member 24 assumes a slightly dish-shaped configuration as shown in FIG. 2, concave on the side the force is applied, convex on the underside adjacent the leads 21. Depending on the length of the leads 21 into the window 22 the formation of the capillary spaces 26 may also be accompanied by a slight deformation by the leads 21 where they immediately overlie the pads 12. This deformation is due to the small area of the pads 12 relative to the area of the leads 21 and is accentuated by the roundness of the pads 12. In fact, such roundness ensures the formation of additional capillary spaces 27 defined by the rounded pad tops and the undersurface of the leads 21. Such deformation of the leads 21 and the accompanying formation of the capillary spaces 27 are not, however, necessary to the present invention.

Next, energy is passed to the bonding site defined by the urged together area of contact of the leads 21 and the pads 12. Such energy may be heat which may be generated by any convenient means. The bonding energy is preferably applied to the bonding site by passing it first through the package 10, then through the pads 12 (both of which are the second workpiece), then to the bonding site. In this example the heat energy is sufficient to form a eutectic bond between the tin-plated conductors 16 and the gold-plated pads 12.

It should be noted that the passage of the bonding energy to the bonding site through the second workpiece (package 10 and pads 12) while applying the urging force to the first workpiece (leads 21) facilitates observation of the bonding site when the member 24 is transparent. Specifically, one reason for the large size and non-transparency of prior art bonding tools is due to these tools being the device by which heat is applied to the site as well as the urging force-applying member. Both functions are best carried out by metal tools. The present invention separates the urging functions and energy-applying functions and performs them by separate facilities.

It should also be noted that where the bonding energy is applied to the bonding site through the second workpiece, such energy must not be capable of damaging that workpiece. For example, here the second workpiece is the I.C. Package 10 and the pads 12. The circuitry inside the package 10 includes a silicon chip bonded to a ceramic at 370° C for 9 seconds. The eutectic bond, to be described below, is formed between the pads 12 and the leads 21 at 280° C for 2 seconds, thus avoiding damage to the package 10.

Molten components due to bond formation, which components, in the present example, constitute gold, tin or a combination of the two, are attracted into and held within the capillary spaces 27 as shown in FIG. 2. Thus creep of these molten components along the conductors 16 is avoided as is any undesirable vertical build-up of these molten components in the area of the bond site.

The method described above can obviously be carried out to bond a single lead 21 to a single conductive pad 12, or for that matter, to bond together any single pair of workpieces. In effecting such a single bond and/or to facilitate the appropriate deformation of the planar member 24, it may be convenient to provide a second support other than the pair of workpieces being bonded together so that the planar member 24 may be deformed as shown in FIG. 2. This second support (not shown) would, with respect to FIGS. 1 and 2, coincide with and take the place of one of the lead-pad pairs 21/12 shown.

Turning now to the apparatus for effecting the method described above, reference is again made to FIGS. 1 and 2. The electrical circuit package 10 or other workpiece is insertable into a recess 30 formed within a body 32 of a thermally insulative material such as Teflon resin, ceramic or other refractory material. The shape of the cavity 30 is such that it conforms and is complementary to the shape of the package 10, whatever that shape may be. The depth of the cavity 30 is such that the pads 12 protrude therefrom in a manner such that appropriate bonding sites with the corresponding leads 21 may be effected.

At the bottom of the recess 30, facilities 34 are provided for supplying energy, such as heat, to the bonding sites. Exemplary facilities are a strip or coating of a resistive material 36 which may form the bottom of the cavity 30 as shown. In the example given the resistive material 36 is stainless steel and is connected to a voltage source (not shown) by a pair of leads 38—38.

A top surface 40 of the body 32 forms a work surface for the substrate 14. This work surface 40 is so formed that the substrate 14 may be placed thereon to permit the upper portion of the package 10 and the pads 12 to protrude into the window 22. The height of the surface 40 may be adjusted by means not shown so that when the substrate 14 is placed as shown in FIG. 1, the leads 21 lightly contact the pads 12 within the window 22 as shown. Obviously automatic means may be provided for moving both the package 10 and the substrate 14 with the leads 21 thereon into the work position shown in FIGS. 1 and 2.

The planar member 24 may be brought into the vicinity of the bond sites by any convenient means. One example of such means is that depicted in the FIGS., specifically, a metal frame 42 made of nickel and coated with silver having a window 44 formed therethrough. The member 24 is adhered to and carried by the frame by any convenient method to lie beneath the window 44. The dimensions of the frame 42 are such that, if desired, the formation of the bond between the conductors 16 and the pads 12 may be observed through the member 24 when that member comprises a transparent material such as the microscope slide cover glass discussed previously. Moreover, the alignment of the leads 21 and the pads 12 may also be observed through the member 24 if the window 44 is properly formed. Visual observation both of alignment and of bond formation is indicated at 46.

In operation, after the package 10 has been brought into the recess 30 and the leads 21 have been aligned with their corresponding pads 12, the substrate 14 rests on the work surface 40, and the frame 42 is moved to position the planar member 24 immediately over the bonding sites. Such alignment may have been effected by visual observation through the member 24.

Next, a plunger 48 is moved downwardly from a normal up position until it touches the top surface of the member 24. The end of the plunger 48 is rounded, as shown, to obviate any canting errors, such as those caused by non-verticalness in the plunger's movement or by the member 24 not being horizontal due to differing heights of the lead/pad pairs. Further downward movement of the plunger 48 results in slight deformation of the planar member 24 as shown in FIG. 2. Specifically, because the planar member 24 is supported at two points namely, at either one bonding site and a support, as discussed above, or at two or more separate bonding sites, downward motion of the plunger deforms the member 24. If more than two bonding sites are involved, the flexibility of the member 24 permits all such bonding sites to be contacted by the member 24 upon downward movement of the plunger 48. It should be noted that the point of contact of the plunger 48 and the member 24 is preferably central with respect to any and all bonding sites that may be involved.

Besides deforming the member 24, downward movement of the plunger 48 also deforms the frame 42. This minimizes the risk of the breaking of the adhesion between the member 24 and the frame 42, but flexibility of the frame 42 is not necessary to the present invention.

Ultimately, the plunger's downward movement deforms the member 24 so that all bonding sites are contacted and so that each lead 21 is firmly urged against its corresponding pad 12. At this time the heating facilities 34 are energized by applying an appropriate voltage to the leads 38. Heat passes from the resistive material 36 through the package 10 then through the pad 12 to the bonding site where, ultimately, eutectic bonds between the leads 21 and the corresponding pads 12 are formed. As noted previously, the formation of these bonds may be observed through the planar member 24 when such member is glass or the like as shown by the numeral 46 in FIG. 2.

After formation of the bond the plunger is returned to its upward position and the frame 42 is moved away from the bond sites until the member 24 is separated therefrom. At this time the package 10 and the substrate 14 and leads 21 which are now attached to the pads 12 are removed from the work location depicted in FIGS. 1 and 2. Again, this removal may be effected by means of automatic apparatus, not shown.

One primary advantage of the method and apparatus described above are the formation of the capillary spaces 26 which attract molten components due to bond formation thereinto thus preventing undesirable creep and build-up. Moreover, the flexibility of the member 24 permits simultaneous bonding of a number of leads and their corresponding pads even though the bonding sites formed thereby vary in vertical height.

Also, if the planar member 24 is chosen to be of a transparent material, such as glass, both alignment and bond formation may be observed therethrough.

It should also be noted that regardless of the composition of the member 24, it acts as a heat sink. Specifically, because heat is passed to the bonding site through a path other than a path involving the member 24, the heat sink capabilities of the member 24 limit excessive melting of the metals at the bonding site.

Although certain embodiments of the invention have been shown in the drawings and described in this specification it should be understood that the invention is not limited thereto and is capable of modification. Moreover, this invention may be arranged differently than as depicted without departing from the spirit and scope thereof.

I claim:

1. An improved method of bonding together a first and a second workpiece at a bonding site, of the type wherein bonding energy is applied to the site while the workpieces are urged together, the energy melting contacting portions of at least one of the workpieces at the site to form a bond, which method comprises the step of:
    a. urging the workpieces together at the site during the application of bonding energy, by moving a rigid, self-supporting, deformable planar member into engagement with the first workpiece, and by slightly deforming the planar member to form a capillary space between the member and the first workpiece, the capillary space attracting molten components at the site thereinto.

2. The method of claim 1 wherein the capillary space substantially surrounds the bonding site.

3. The method of claim 2 wherein the planar member is transparent, which method includes the additional steps of:
    b. optically monitoring the formation of the bond through the member; and
    c. terminating the energy application when the bond has been formed.

4. The method of claim 3 wherein the bonding energy is heat, and which includes the additional step of:
    d. passing heat to the bonding site through the second workpiece.

5. The method of claim 1 in which a plurality of first workpieces are simultaneously, respectively bonded to a plurality of corresponding second workpieces at a plurality of bonding sites and wherein step (a) is effected substantially simultaneously at all the sites by applying to the member a force at a point generally central to all such sites.

6. A method of attaching a lead to a contact pad carrier on the exterior of a packaged electrical circuit, a eutectic bond between the lead and the pad being formable at a predetermined temperature when they are urged together, which method comprises the steps of:
    a. aligning and contacting the pad with the lead at a bonding site;
    b. relatively moving a deformable, rigid, self-supporting planar member and the site to move the member proximate the site;
    c. urging together the lead and the pad by slightly deforming the member to form a capillary space between the one surface of the member and the lead, and then d. passing heat to the site through the package until the site reaches the predetermined temperature, such heat being insufficient to damage the circuit, molten components at the site from the lead and the pad being attracted into the capillary space.

7. The method of claim 6 wherein the member is transparent, which method includes the additional steps of:
   e. optically monitoring the formation of the eutectic bond through the member; and
   f. terminating the heat passage when the eutectic bond has been formed.

8. The method of claim 7 wherein step (a) is effected by optically monitoring the alignment through the member.

9. The method of claim 6 in which a plurality of leads are simultaneously attached to a plurality of corresponding pads at a plurality of sites and wherein step (c) is effected substantially simultaneously at all the sites by applying to the member a force at a point generally central to all such sites.

10. A method of bonding together at a bonding site a pair of contacted workpieces which are bondable by applying heat thereto while they are urged together, comprising the steps of:
    a. urging the contacted workpieces together by moving into engagement with a first of the workpieces, and slightly deforming, rigid, self-supporting planar member to form a capillary space between the member and the first workpiece; and
    b. passing heat to the site through a second of the workpieces, molten components at the site being attracted into the capillary space.

11. Apparatus for bonding together a pair of workpieces at a bonding site by the application of energy thereto as the workpieces are urged together, the energy melting portions of the workpieces at the site, comprising:
    a. means for applying the energy to the site;
    b. a deformable, rigid self-supporting, planar member; and
    c. means for engaging one of the workpieces with the member to urge the workpieces together and for slightly deforming the member so that a capillary space is formed between the member and the one workpiece, molten components at the site being attracted into the capillary space.

12. The apparatus of claim 11 wherein element (c) includes:
    $c_1$. means for supporting the member at a location remote from the point of engagement thereof with the one workpiece; and
    $c_2$. means for applying a force to the member at a point generally intermediate the support location and the point of engagement.

13. The apparatus of claim 12 for bonding together another pair of workpieces simultaneously with the bonding together of the first workpiece pair wherein element ($c_1$) includes one workpiece of the additional pair.

14. The apparatus of claim 13 wherein the element ($c_2$) includes a plunger movable toward and away from the member, the plunger having a rounded end for engagement with the member.

15. The apparatus of claim 14 wherein element (b) is a piece of microscope slide cover glass having a thickness of 0.003–0.006 inch.

16. The apparatus of claim 15 which further includes:
    d. a frame having a window therethrough; and
    e. means for mounting the glass to the frame over the window.

17. The apparatus of claim 16 in which the other workpiece of both pairs is carried on a package and wherein element (a) includes:
    $a_1$. a support having a selectively heatable recess therein, the recess having a shape complementary to the shape of the package, the heat being applied through the package, then through the other workpiece of each pair, then to the bonding site.

18. Apparatus for bonding together a plurality of pairs of workpieces at a plurality of bonding sites by the application of energy to the workpieces in each pair as they are urged together, the energy melting a portion of at least one of the workpieces, comprising:
    a. a rigid, self supporting deformable planar member;
    b. means for engaging one of the workpieces with the member to urge the workpieces together and for slightly deforming the member so that a capillary space is formed between the member and the one workpiece in each pair; and
    c. means for applying the energy to the workpiece pairs, molten components being attracted into the capillary spaces.

19. The apparatus of claim 18 wherein element (b) includes:
    $b_1$. means for applying a force to the member at a point generally central to all of the sites.

20. The apparatus of claim 19 wherein element ($b_1$) includes:
    $b_2$. a plunger movable toward and away from the member, the plunger having a rounded end for engagement with the member at the central point.

21. The apparatus of claim 20 in which the other workpiece of each pair is carried on a package, wherein the bonding energy is heat, and wherein element (c) includes:
    $c_1$. a support having a selectively heatable recess therein, the recess having a shape complementary to the shape of the package, the heat being applied through the package then through the other workpiece of each pair and then to each bonding site.

22. In a method of bonding a plurality of flat, flexible, metallic leads to a plurality of projecting contacts of an electrical circuit components, of the type wherein the leads and contacts are brought together to define bonding sites and bonding energy is applied to the sites to form an individual bond between the contacts and meltable inner surfaces of the corresponding leads, the improvement which comprises:
    moving a transparent, deformable planar member into engagement with the outer surfaces of all of the leads so as to urge the inner surfaces of each lead against a corresponding contact, the planar member being sufficiently large to engage all of the leads simultaneously; and
    deforming the planar member both to firmly urge the inner contacting portions of the flexible leads into engagement with the contacts and to form capillary spaces between the inner surface of the planar member and the outer surface of the leads and the contacts around the bonding sites, the transparent planar member permitting inspection of the individual bonding sites prior to and during bonding, and the capillary spaces attracting molten metal into those spaces during bonding.

23. In a method of bonding a flexible element to a projecting portion of a workpiece, of the type wherein the element and portion are brought together at an interface to define a bonding site between them and bonding energy is applied to the site to melt portions of the materials at the interface to form a bond between the portion and an inner surface of the element, the improvement which comprises:

moving a deformable planar member into engagement with the outer surface of the element so as to force the inner surface of the element against the portion of the workpiece; and deforming the planar member to firmly urge the inner contacting surface of the element into engagement with the portion and to form a capillary space between the planar member and the outer surface of the element.

24. A method as in claim 23, wherein deformation of the planar member causes consequent deformation of the flexible element about the portion to form a further capillary space between the element and the portion in the immediate area of the bond, the capillary spaces attracting molten material into these spaces during bonding.

25. An improved method of bonding together a first and a second workpiece at a bonding site, the method being of the type wherein bonding energy is applied to the site while the workpieces are urged together, the energy melting contacting portions of at least one of the workpieces at the site to form a bond, wherein the improvement comprises the step of:

urging the workpieces together at the site during application of bonding energy by i. moving a rigid, self-supporting, deformable planar member into engagement with a first workpiece, and ii. deforming the planar member to form a capillary space between the member and the first workpiece, the capillary space attracting molten components at the site thereinto.

26. An improved method of bonding together a first and a second workpiece at a bonding site, the method being of the type wherein bonding energy is applied to the site while the workpieces are urged together, the energy melting contacting portions of at least one of the workpieces at the site to form a bond, wherein the improvement comprises the step of:

urging the workpieces together at the site during application of bonding energy by i. moving a planar member into engagement with a first workpiece, and ii. pressing a rigid force applying member against the outer surface of the planar member at a region laterally spaced from the area of said engagement thereby deforming the planar member to form a capillary space between the planar member and the first workpiece, the capillary space attracting molten components at the site thereinto.

27. An improved method of bonding together a first and a second workpiece at a bonding site, the method being of the type wherein bonding energy is applied to the site while the workpieces are urged together, the energy melting contacting portions of at least one of the workpieces at the site to form a bond, wherein the improvement comprises effecting the urging step by applying a force to a first side of a rigid, self-supporting, deformable planar member during application of bonding energy i. to move the second side of the member into engagement with a first workpiece, and ii. to slightly deform the planar member to form a capillary space between the second side of the member and the first workpiece, the capillary space attracting molten components at the site thereinto.

28. The method of claim 27 wherein the force is applied remote from the point of engagement, and the contour of the member during deformation is characterized by the first side of the member being slightly concave and the second side of the member being slightly convex.

\* \* \* \* \*

UNITED STATES PATENT OFFICE
CERTIFICATE OF CORRECTION

PATENT NO. : 3,998,377
DATED : December 21, 1976
INVENTOR(S) : JACK L. METZ

It is certified that error appears in the above-identified patent and that said Letters Patent are hereby corrected as shown below:

"Abstract" - line 21, cancel "and" second occurrence.

Column 1, line 4, insert parenthesis before and after --now abandoned--.

Column 3, line 46, "In" should begin a paragraph.

Column 8, line 54, claim 6, change "carrier" to --carried--.

Column 10, line 45, claim 22, change "components" to --component--.

Column 10, line 53, claim 22, change "surfaces" to --surface--.

Signed and Sealed this sixteenth Day of August 1977

[SEAL]

Attest:

RUTH C. MASON
Attesting Officer

C. MARSHALL DANN
Commissioner of Patents and Trademarks